United States Patent
Xia et al.

(10) Patent No.: US 7,520,316 B2
(45) Date of Patent: Apr. 21, 2009

(54) HEAT SINK WITH HEAT PIPES

(75) Inventors: Wan-Lin Xia, Shen-Zhen (CN); Tao Li, Shen-Zhen (CN); Min-Qi Xiao, Shen-Zhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 258 days.

(21) Appl. No.: 11/244,912

(22) Filed: Oct. 5, 2005

(65) Prior Publication Data

US 2007/0074857 A1 Apr. 5, 2007

(51) Int. Cl.
*F28D 15/00* (2006.01)
*H05K 7/20* (2006.01)

(52) U.S. Cl. .................... 165/104.33; 165/104.21; 165/80.3

(58) Field of Classification Search ................. 165/185, 165/80.3, 104.26, 104.33, 104.34; 361/699, 361/700; 257/715; 174/15.2
See application file for complete search history.

(56) References Cited

U.S. PATENT DOCUMENTS

| | | | |
|---|---|---|---|
| 5,283,715 A * | 2/1994 | Carlsten et al. | 361/702 |
| 6,424,528 B1 * | 7/2002 | Chao | 361/700 |
| 6,779,595 B1 * | 8/2004 | Chiang | 165/104.33 |
| 6,945,318 B2 * | 9/2005 | Ma et al. | 165/104.33 |
| 2005/0067144 A1 * | 3/2005 | Chou | 165/80.3 |
| 2005/0082041 A1 * | 4/2005 | Chen et al. | 165/104.33 |
| 2005/0098304 A1 * | 5/2005 | Lin et al. | 165/104.33 |
| 2005/0224217 A1 * | 10/2005 | Whitney | 165/104.33 |
| 2006/0082972 A1 * | 4/2006 | Kim | 361/709 |
| 2006/0203451 A1 * | 9/2006 | Wei et al. | 361/700 |

FOREIGN PATENT DOCUMENTS

| | | |
|---|---|---|
| CN | 02248248.2 | 10/2003 |
| CN | 02248249.0 | 10/2003 |
| CN | 03280220.X | 12/2004 |
| JP | 2004311718 A * | 11/2004 |
| TW | 586650 | 5/2004 |
| TW | M243001 | 9/2004 |

* cited by examiner

*Primary Examiner*—Tho V Duong

(57) ABSTRACT

A heat sink with heat pipes includes a base (10). The base includes a bottom surface contacting a heat-generating component (40), an upper surface opposite to the bottom surface, and a plurality of grooves (14) defined on the upper surface of the base. The heat sink further includes two heat pipes (32, 36) received in the grooves, each heat pipe comprising an evaporating section (322, 362) and a condensing section (324, 364) respectively, wherein the evaporating sections of the heat pipes are closely arranged on a portion of the base, and wherein the condensing sections of the heat pipes spread out from said portion of the base by extending in the grooves to other parts of the base so that heat absorbed by the base from the heat-generating component can be evenly spread to the whole base.

5 Claims, 4 Drawing Sheets

HEAT SINK WITH HEAT PIPES

BACKGROUND

1. Field

The present invention relates to a heat sink for removing heat from heat-generating electronic devices, and more particularly to a heat sink having heat pipes embedded therein.

2. Related Art

Over the past few years, CPU's operation speeds have been increasing at a dramatic rate. In order to generate rapid speeds, a CPU must have more transistors, draw more power and have higher clock rates. This leads to a great deal of heat produced by the CPU in the computer. If not been removed in time, the heat can accumulate on and overheat the CPU, resulting in degradation of reliability and system malfunction.

Heat sinks have been added to all modern CPUs to alleviate the effect of the heat on the processor by enforcing heat dissipation into the surrounding environment. A typical heat sink generally comprises a base contacting a CPU and a plurality of fins arranged on the base. Most of heat generated by the CPU is absorbed by the base, then conducted upwardly from the base to the fins. However, only a part of the base, usually the middle part, contacts the CPU. The heat originating from the CPU is directly absorbed by the middle part of the base and can not be quickly spread to the other parts of the base. This results in an overheating of the middle part of the base, while the temperature of the other parts of the base is low. The fins on the other parts of the base away from the middle part are not efficiently used. The efficiency of the heat sink is desired to be improved by sufficient use of all of the fins on the base.

SUMMARY

Accordingly, what is needed is a heat sink which has a uniform heat distribution therein to improve cooling performance of the heat sink.

A heat sink in accordance with a preferred embodiment of the present invention comprises a base. The base comprises a bottom surface contacting a heat-generating component, an upper surface opposite to the bottom surface, and a plurality of grooves defined on the upper surface of the base. The heat sink further comprises two heat pipes received in the grooves, each heat pipe comprising an evaporating section and a condensing section respectively, wherein the evaporating sections of the heat pipes are closely arranged on a portion of the base which is directed to contact with the heat-generating component, and wherein the condensing sections of the heat pipes spread out from said portion of the base by extending in the grooves to other parts of the base in order to uniformly distribute the heat on the whole base.

Other advantages and novel features of the present invention will become more apparent from the following detailed description when taken in conjunction with the accompanying drawings, in which:

DETAILED DESCRIPTION OF THE INVENTION

Figure 1:
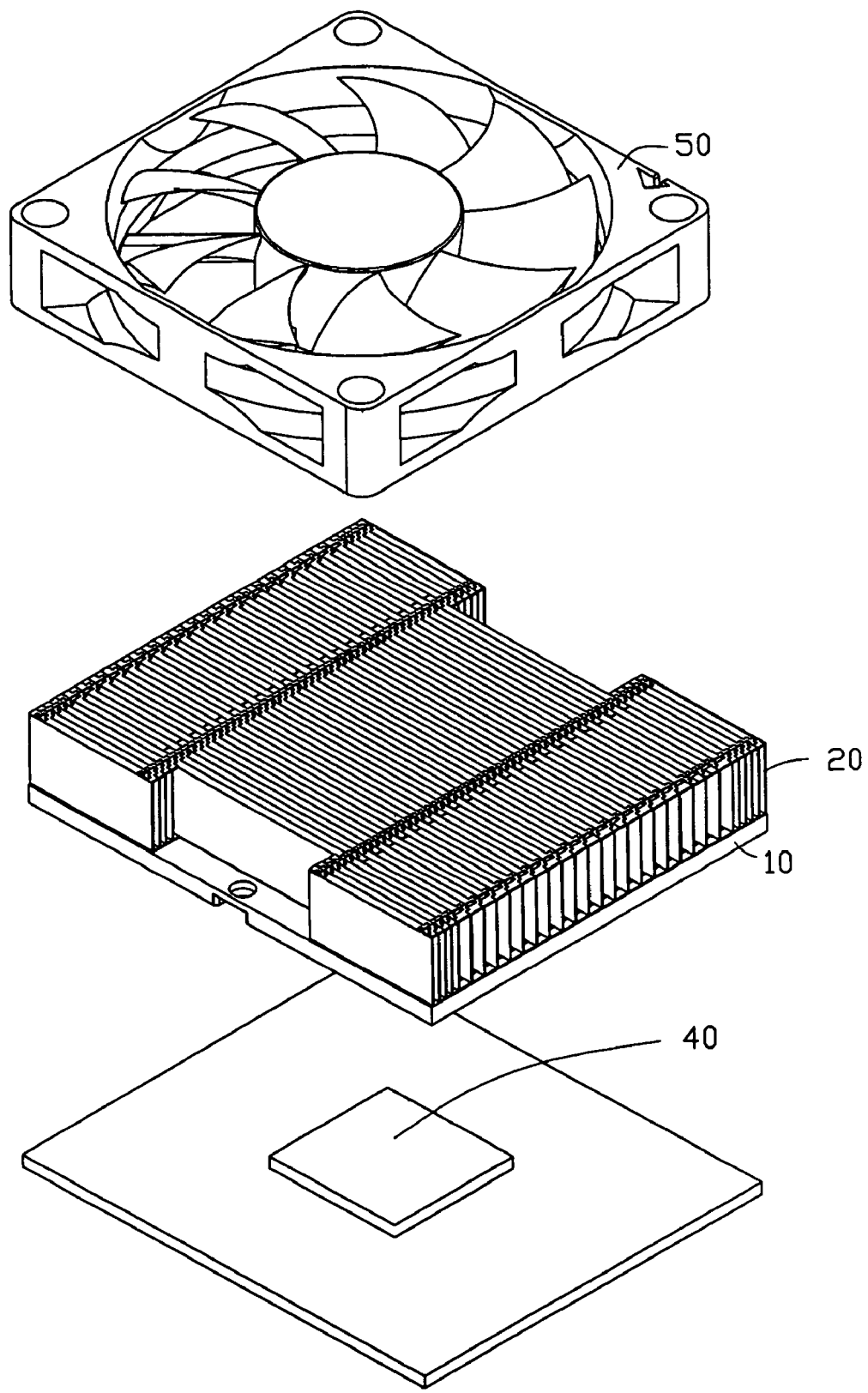
FIG. 1 shows a heat sink in accordance with a preferred embodiment of the present invention, a fan and a printed circuit board having a heat-generating component mounted thereon.
Figure 2:
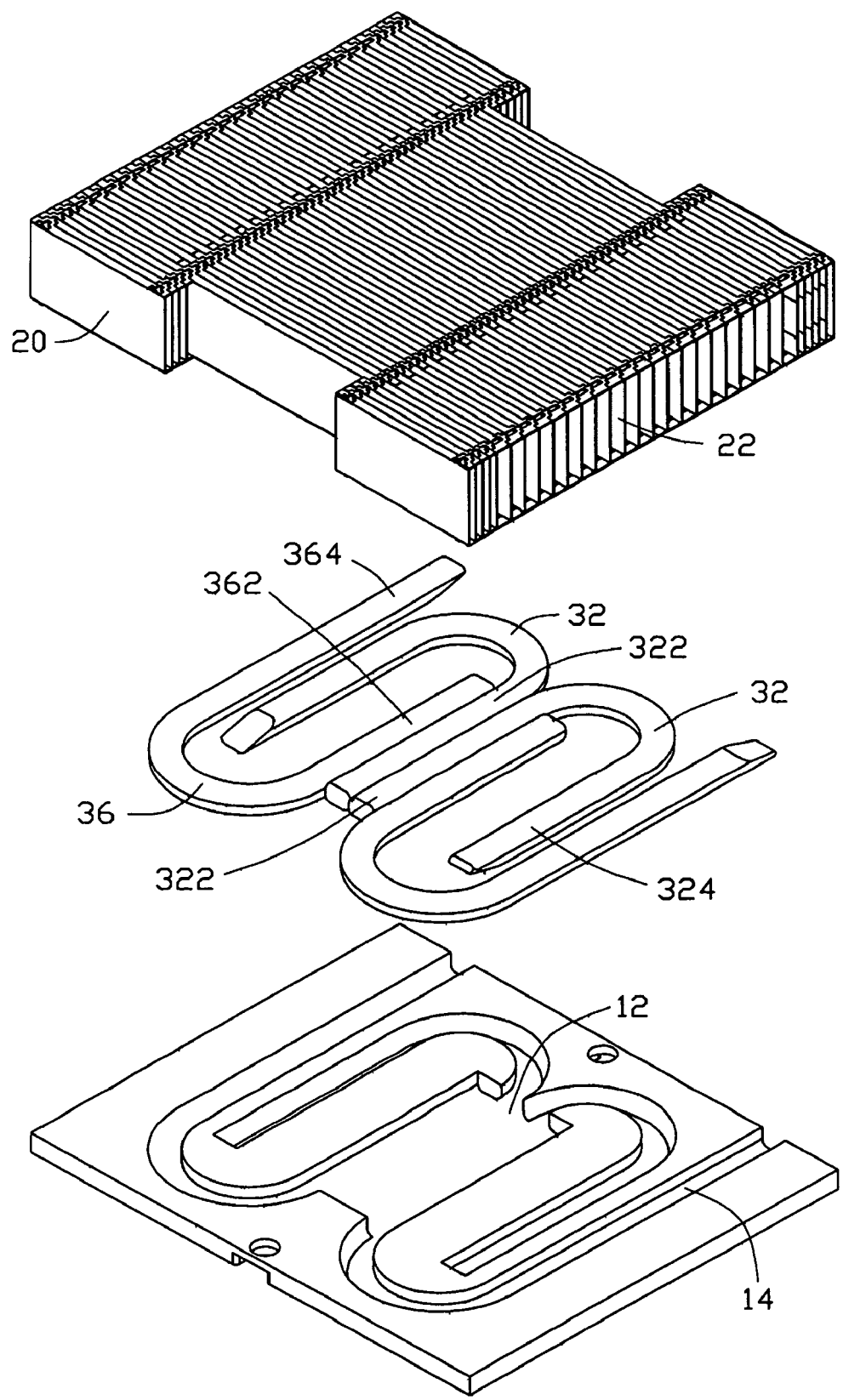
FIG. 2 is an enlarged, exploded view of the heat sink of FIG. 1.
Figure 3:
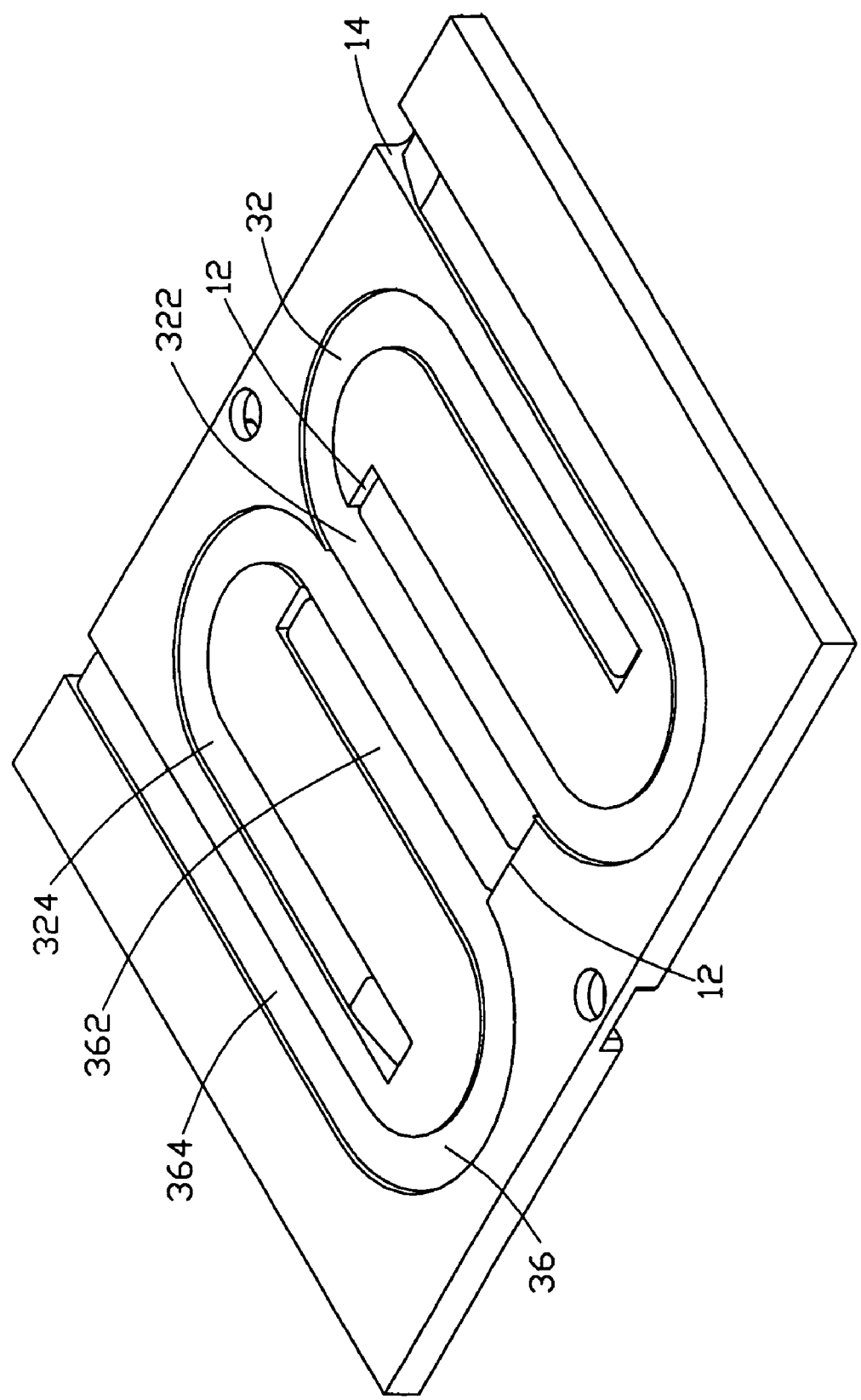
FIG. 3 is an assembled, isometric view of a base and four heat pipes of the heat sink of FIG. 2.

Referring to FIGS. 1-3, a heat sink in accordance with a preferred embodiment of the present invention comprises a base 10, a fin assembly 20 arranged on the base 10, and two pairs of heat pipes 32, 36. The heat pipes 32, 36 are sandwiched between the base 10 and the fin assembly 20. A fan 50 is attachable to a top side of the fin assembly 20 to blow air downwards passing through the fin assembly 20.

Each heat pipe 32 is flattened and U-shaped. Each heat pipe 32 comprises two separate arms which are in substantially identical length and are respectively functioned as an evaporating section 322 and a condensing section 324. Each heat pipe 36 is flattened and U-shaped. Each heat pipe 36 also comprises two separate arms which are in different length and are respectively functioned as an evaporating section 362 and a condensing section 364. However, the heat pipes 32, 36 are not limited to be U-shaped as described in the preferred embodiment, other shaped heat pipes such as V-shaped, C-shaped, or L-shaped heat pipes are also feasible to be used in the heat sink.

The base 10 is made of a heat conductive material, such as copper or aluminum. The base 10 has a bottom surface for contacting a heat-generating component 40 mounted on a printed circuit board (not shown) and an upper surface opposite to the bottom surface. The base 10 comprises a depression 12 defined in a central portion of the base 10 which is typically directed to the heat-generating component 40 and a plurality of grooves 14 extending from the depression 12 to other parts of the base 10. The depression 12 and the grooves 14 are defined at the upper surface of the base 10 to receive the heat pipes 32, 36. The heat pipes 32, 36 are assembled in the depression 12 and the grooves 14 by soldering or adhering to form a flat top surface together with the base 10. In combination of the heat pipes 32, 36 and the base 10, the heat pipes 32 are juxtaposed to each other with the evaporating sections 322 thereof abutting side-by-side against each other. The heat pipes 32 are so oriented that they open to a same direction. The heat pipes 36 are so arranged that their evaporating sections 362 extend into respective spaces defined by the U-shaped heat pipes 32 and abut side-by-side against respective evaporating sections 322 of the heat pipes 32. The condensing sections 364 of the heat pipes 36 are located outside of and near and parallel to the condensing sections 324 of the heat pipes 32, respectively. The heat pipes 36 are so oriented that they open to a direction opposite to that of the heat pipes 32. The evaporating sections 322, 362 are closely arranged in the depression 12 and the depression 12 has a highest temperature than other parts of the base 10. The condensing sections 324, 364 spread out from said depression 12 and extend in the grooves 14 to reach the other parts of the base 10. The evaporating section 362 of the heat pipe 36 is located between the evaporating and condensing sections 322, 324 of the heat pipe 32 close to the heat pipe 36. The evaporating section 322 of the heat pipe 32 is disposed between the condensing section 324 of the heat pipe 32 and the evaporating section 322 of the other heat pipe 32. The condensing section 324 of the heat pipe 32 is located between the condensing section 364 and the evaporating section 362 of the heat pipe 36.

Thus, heat originated from the heat-generating component 40 can be quickly absorbed by the evaporating sections 322, 362 which are closely arranged at the central portion of the base 10, and then be quickly spread to the other parts of the base 10 by the condensing sections 324, 364. So, a uniform temperature distribution in the whole base 10 is achieved. This avails to uniformly transfer the heat from the base 10 to the fin assembly 20 and to improve the utilization of the fin assembly 20 to dissipate the heat; thus, the efficiency of the heat sink is promoted.

The fin assembly 20 comprises a plurality of individual fin plates 22 arranged side by side. Each fin plate 22 is made of a highly thermal conductive material such as aluminum or copper. The fin assembly 20 can be mounted on the upper surface of the base 10 by soldering or adhering so that the heat pipes 32, 36 are completely sandwiched between the base 10 and the fin assembly 20. Thus, the fin assembly 20 can directly absorb heat from the heat pipes 32, 36 and the base 10. Other fins such as folded fins, pin fins may likewise be utilized in the present invention.

FIG. 1 shows the heat sink used to cool down the heat-generating component 40. When the heat sink is used, the base 10 is disposed on a top surface of the heat-generating component 40. Heat generated by the component 40 is conducted to the central portion of the base 10, then transferred to other parts of the base 10 by the heat pipes 32, 36 so that the heat is quickly and evenly spread to the whole base 10. Then the heat is conducted to the fin assembly 20 from the base 10 and the heat pipes 32, 36, to be dissipated to surrounding air by the fin assembly 20. The fan 50 mounted on the fin assembly 20 enhances air convection in the fin assembly 20 to help heat dissipation of the fin assembly 20. Thus, the fin assembly 20 can efficiently absorb the heat from the base 10 and dissipate the heat. The heat dissipation efficiency of the heat sink can thus be improved.

Figure 4:
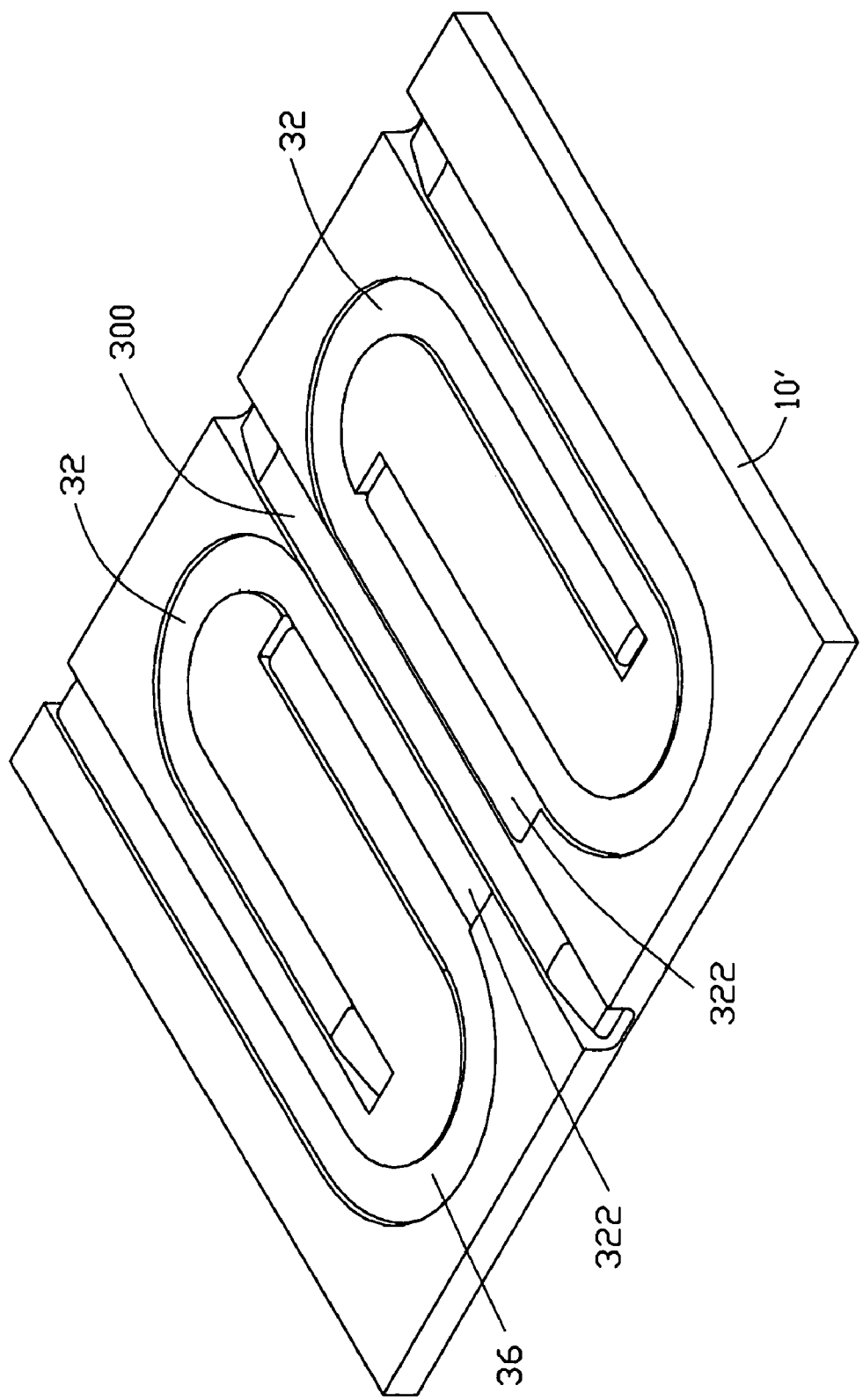
FIG. 4 is similar to FIG. 3, but having an additional heat pipe engaged in the base.

FIG. 4 illustrates an alternative base 10' having an additional straight heat pipe 300 disposed between the evaporating sections 322 of the heat pipes 32 to further promote heat-spread of the heat from the heat-generating component 40 to the whole base 10'. The heat pipe 300 has an evaporating section located at a central thereof, and two condensing sections at two ends thereof, respectively.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat sink with heat pipes comprising:
   a base comprising a bottom surface for contacting a heat-generating component, an upper surface opposite to the bottom surface, a plurality of grooves defined on the upper surface of the base; and
   two heat pipes received in the grooves, each pipe comprising an evaporating section and a condensing section;
   wherein the evaporating sections of the heat pipes are closely arranged on a portion of the base which is directed for contacting with the heat-generating component, and wherein the condensing sections of the heat pipes spread out from said portion of the base by extending in the grooves to other parts of the base in order to uniformly distribute heat on the whole base;
   wherein the evaporating sections of the heat pipes are parallel to each other and abut against each other; and
   wherein the heat pipes are juxtaposed to each other;
   wherein the heat pipes are U-shaped; and
   wherein the evaporating section of one of the heat pipes is disposed between the evaporating section and the condensing section of the other heat pipe.

2. The heat sink with heat pipes as claimed in claim 1, wherein the evaporating section of one of the heat pipes is disposed between the condensing section of the one heat pipe and the evaporating section of the other heat pipe.

3. The heat sink with heat pipes as claimed in claim 1, further comprising a fin assembly securely attached on the upper surface of the base so that the heat pipes are sandwiched between the base and the fin assembly.

4. The heat sink with heat pipes as claimed in claim 3, further comprising a fan mounted on one side of the fin assembly.

5. A heat sink with heat pipes comprising:
   a base having a bottom face for contacting with a heat-generating electronic component and a top face defining a depression and a plurality of grooves extending from the depression;
   a plurality of heat pipes having evaporating sections received in the depression and condensing portions received in the grooves; and
   a fin assembly mounted on the top face of the base, wherein the evaporating sections of the heat pipes abut side-by-side against each other, wherein the evaporating sections are parallel to each other, wherein the heat pipes have a first group of U-shaped heat pipes oriented at a first direction and a second group of the U-shaped heat pipes oriented at a second direction different from the first direction, and wherein each of the condensing sections of the plurality of heat pipes is parallel to each of the evaporating sections of the plurality of heat pipes.

* * * * *